United States Patent [19]

Castleman

[11] Patent Number: 4,906,802
[45] Date of Patent: Mar. 6, 1990

[54] MOLDED CHIP CARRIER

[76] Inventor: Neal Castleman, 19124 PCH, Malibu, Calif. 90265

[21] Appl. No.: 157,927

[22] Filed: Feb. 18, 1988

[51] Int. Cl.$^4$ .............................................. H01L 23/02
[52] U.S. Cl. ..................................... 174/52.4; 29/832
[58] Field of Search .......................... 174/52 FP, 52.4; 357/74; 29/832

[56] References Cited

U.S. PATENT DOCUMENTS 4,298,769  11/1981  Richman .......................... 174/52.4
4,682,270   7/1987  Whitehead et al. ............. 174/52 FP

FOREIGN PATENT DOCUMENTS 2171355  8/1986  United Kingdom .

Primary Examiner—Leo P. Picard
Assistant Examiner—David A. Tone
Attorney, Agent, or Firm—Ashen, Golant, Martin & Seldon

[57] ABSTRACT

A molded chip carrier includes an integral carrier body made from a first molded section having a predetermined shape and a second molded section having a second predetermined shape. One of the first and second molded sections is made from a non-conductive material and the other section is made from a non-conductive material that is capable of receiving a deposit of conductive material. A conductive material is deposited on the outer exposed surface of the molded section capable of receiving the deposit. This particular molded section has an outer surface that defines a plurality of non-intersecting, continuous paths that form the input-/output leads on the carrier body. The chip carrier includes a protective cap that can be placed over an electronic chip mounted within the carrier body.

38 Claims, 6 Drawing Sheets

MOLDED CHIP CARRIER

BACKGROUND OF THE INVENTION

1. Field of the Invention

This invention relates generally to solid state components, and more particularly, to a molded chip carrier package that is adapted for mounting on a circuit board. The invention is also directed to the method for making this molded chip carrier.

2. Prior Art

The advent of solid state components, and more particularly the integrated circuit (IC), an electronic device that utilizes a chip of specialized material to perform specific electronic functions, have revlutionized the electronics industry and have practically affected every phase of life today, from consumer goods to computer and business equipment, to military equipment. Amazingly, a small piece of specially prepared material, commonly called a "chip", has replaced antiquated, power consuming, vacuum tubes that were previously used to perform similar electionics functions. Not only has the chip produced similar results, but it has created an entirely new field of electronic capabilites. The chip and its packaging have not only greatly reduced the power consumption in a circuit, but has tremendously decreased the size of the components used in the circuit.

A chip used in an integrated circuit is usually a single substrate on which active or passive circuit elements have been fabricated using one of many well known semiconductor techniques such as diffusion, passivation, masking, photoresist and epitaxial growth. However, a chip is not ready for use until it is packaged within a protective housing which provides external input and output terminals. In the past, most chips have been packaged in rectangular shaped plastic housings that have rows of leads or pins that extend outward from the bottom of the housing. The pins are usually arranged in two parallel rows extending along the length of the housing with each pin positioned near the peripheral edge of the housing. The pins are usually mounted to a circuit board by first placing the pins through pre-drilled holes located in the circuit board and then soldering the ends of the pins to the opposite side of the circuit board. This type of component, generally referred to as a dual-in-line package (DIP), has been the industry standard for a number of years.

Despite the popularity of dual-in-line packages, electronic circuit designers have been seeking alternative packaging to negate some of the problems associated with DIPs. For example, design engineers have found that DIPs which accommodate 64 or more pins consume valuable space on circuit boards; and that as the number of pins increases, the electrical performance of the component decreases. It is quite possible for DIPs having 64 pins or more to have pin lengths up to 1.6 inches as measured from the central chip to the outermost edge of the pin. This length can produce unwanted inductances along with propagation delays to the associated circuitry. Additionally, DIPs require the circuit board to be pre-drilled with properly spaced holes to receive the pins of the DIP. These and other disadvantages prompted many electronic designers to look for new packaging to accommodate the chip.

This search for a smaller and more reliable package prompted the discovery of surface mounted devices (SMD) that are generally mounted and soldered onto one side of a printed circuit board. In order to accomplish this type of mounting, the circuit board has to be printed with conductive pads or "footprints" that correspond to the spacing of the leads on the SMD. The surface mounted device is simply placed on its pads and soldered to the board.

One popular SMD, referred to in the industry as a chip carrier, includes a square or rectangular housing having a central portion upon which the chip or chips are mounted. The chip carrier also includes input and output pins or leads located on all four sides of the housing. Typically, the spacing between the input/output leads is 0.05 inch, half of DIP pin spacing. Additionally, the newer chip carrier packages can take up less than one-fourth of the area that conventional DIPs take up. Also, since the chip carrier has a smaller input/output lead, electrical performance is enhanced through lower inductances and shorter propagation delays.

Chip carriers generally come in two types namely ceramic and plastic. Ceramic chip carries, as the phrase implies, are made from ceramic materials and are generally used for military and other high reliability applications which require ceramics hermeticity and high temperature properties. A ceramic chip carrier is usually leadless, that is, it lacks leads extending on the sides of the carrier body, but rather has small conductive pads located on the bottom surface of the carrier body. Due to their higher quality, ceramic chip carriers are generally more expensive than plastic chip carriers.

Plastic chip carriers, to which the present invention is directed, are more widely used in commercial and industrial applications where the environment is less severe and the need for cost effectiveness dominates. One popular plastic chip carrier includes a plastic-like housing or body which carries a stamped metal lead frame. The lead frame forms numerous individual leads that are bent down around the perimeter of the housing. The leads can be formed under the housing in a shape similar to the capital letter "J". This type of lead, commonly called a J-lead, provides sufficient contact for attaching the chip carrier to a circuit board or other substrate since the J-lead can be soldered to corresponding conductive pads located on the circuit board. Other variations of leads include the gull-wing leads which extend out away from the bottom of the carrier body rather than under it.

While plastic chip carriers are advantageous in some respects over DIPs, they still possess disadvantages which have hindered their acceptance by the industry. One of the main problems encountered has been in the formation of the lead frames that are attached to the carrier body. Since many chip carriers can have as many as 320 leads, precision of shapes and dimensions required in the dies forming the lead frames increase dramatically, which only adds to the complexity and cost of forming a functional component.

Other shortcomings of chip carriers arise during the soldering of the carrier to the printed circuit board. One of the major difficulties encountered in both manufacturing and mounting the chip carrier is in maintaining lead coplanarity (the straightness of each lead with the mounting plane during soldering). Many manufacturers specify that their components must have a coplanarity of ±2 to ±5 mils in order to achieve proper soldering of the carrier to the circuit board. However, during the manufacturing, transporting and handling of the chip carrier, it is possible for some of the leads to become bent. When this occurs, a technician must rebend the bent leads to enable the chip carrier to properly engage all its mounting pads. If the leads become bent, a technician will have to take additional time and effort to straighten the leads. Sometimes, it is impossible for the technician to properly bend the leads back into their precise shape. When this occurs, the chip carrier becomes useless.

Another shortcoming in using a lead frame is the fact that the leads cannot be bent into elaborate shapes due to the close spacing and thinness of the leads. This effectively reduces the various ways that the leads can be shaped on the carrier body since breakage is possible due to excessive bending. Also, excessive bending can cause some of the leads to come in contact with other leads, which is undesirable in any electronic component. These occurrences can also result in a defective chip carrier.

While the chip carrier has greatly reduced the amount of area that is taken up on a circuit board, it has several disadvantages which hinder its use by some electrical circuit designers. As a result, the electronics industry has not yet fully developed the chip carrier to its full potential as an effective electronic component. Therefore, there is a need for a chip carrier that can be manufactured rather inexpensively and which eliminates these and other disadvantages associated with prior art chip carriers.

SUMMARY OF THE INVENTION

The present invention is directed to a molded chip carrier having an integral carrier body or housing made from a first molded section having a first predetermined shape and a second molded section having a second predetermined shape. These first and second sections cooperate to form an integral body in which certain portions of the first and second sections have exposed outer surfaces that take on particular shapes. One of the first or second sections is made from a material that is relatively more susceptible to receiving a conductive deposit, while the other is relatively more resistant thereto. The exposed surface of this particular section receives a conductive material that defines leads on the carrier body.

More particularly, the first and second sections form an integral carrier body having a top portion, a bottom portion and at least one side portion. The top portion includes a central portion on which a chip is mounted.

One of the first or second sections is molded to form a plurality of noninterconnecting, continuous paths which extend from the top portion, along the side portion and to the bottom portion. The conductive material is deposited on these continuous paths to form the leads on the chip carrier. In one particular form, the conductive material is a metallic deposit.

The invention is also directed to the method of making a chip carrier which consists of the steps of first molding a first section into a first predetermined shape. Next, a second section having a second predetermined shape is molded with the first-mentioned section to form an integral carrier body. This integral body includes exposed outer surfaces of the first and second molded sections. A conductive material is then placed on the exposed outer surface of one of the first or second molded sections.

In one preferred embodiment, one of the sections is made from a nonconductive material and the other section is made from a nonconductive material that is also capable of receiving a conductive deposit. The latter material is referred to as the receptive material. The receptive material can be an insulating plastic with a catalyst that allows the material to undergo adherent metallization.

The present method used to produce the chip carrier body is somewhat similar to a molding process disclosed in U.K. patent application Ser. No. 2,171,355 to Cleveland, et al. It is believed that the present method, however, creates an advantageous chip carrier that is not apparent from the disclosure in the above-mentioned British Application.

The present invention provides an advantageous chip carrier having integral leads that are effectively unbendable and unbreakable during normal shipping and handling. These integral leads substantially eliminate the need to rebend and straighten leads to mount the carrier body onto the conductive pads formed on a printed circuit board. Also, since precision molds can be utilized to form the carrier body and its leads, lead coplanarity can be kept at approximately ±2 mils.

The method used to create this advantageous chip carrier also permits the leads to take on configurations that are virtually impossible to obtain with conventional lead frames. For instance, the leads can be formed having multiple bends, a feature that is nearly impossible to achieve with lead frames due to the thinness and brittleness of the metal making up the frame. Also, the width of each lead can be reduced since precision molding is used. With thinner leads, a greater number of leads can be placed on each side of the carrier body.

BRIEF DESCRIPTION OF THE DRAWINGS

A complete understanding of the present invention and other advantages and features thereof may be gained from a consideration of the following description of the preferred embodiments taken in conjunction with the accompanying drawings in which.

DETAILED DESCRIPTION OF THE PREFERRED EMBODIMENTS

Figure 1:
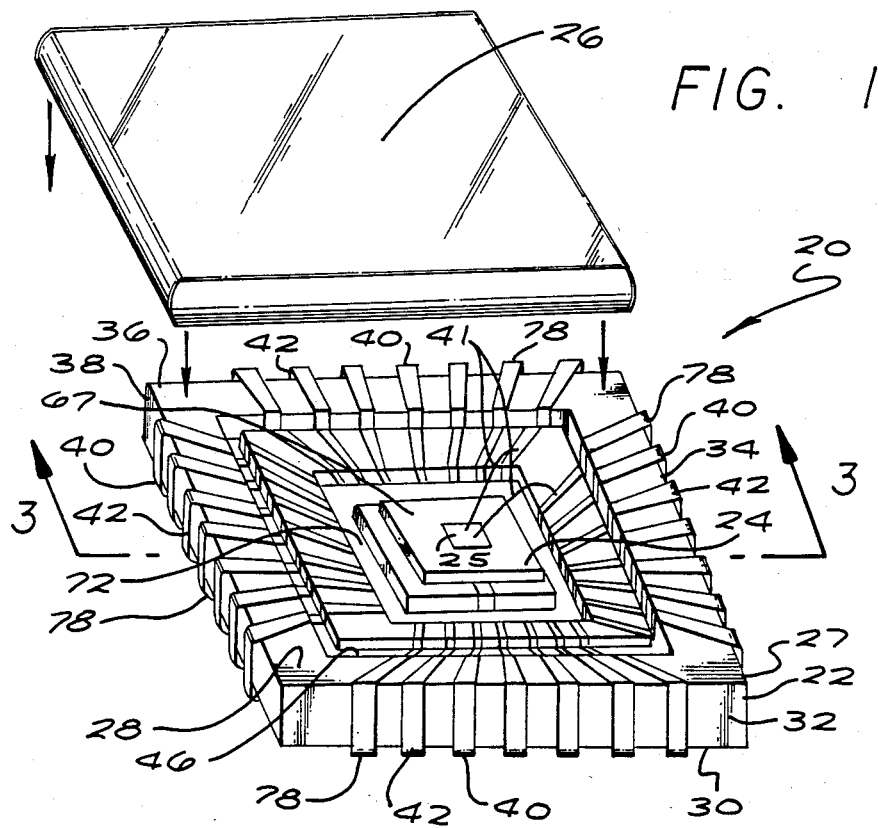
FIG. 1 is a perspective view of a preferred embodiment of the present invention showing the integral carrier body and a protective cap that fits over the carrier body.

While the present invention is susceptible of various modifications and alternative constructions, the embodiments shown in the drawings will herein be described in detail. It should be understood, however, that it is not the intention to limit the invention to the particular forms disclosed; but, on the contrary, the intention is to cover all modifications, equivalences and alternative constructions falling within the spirit and scope of the invention as expressed in the appended claims.

Figure 6:
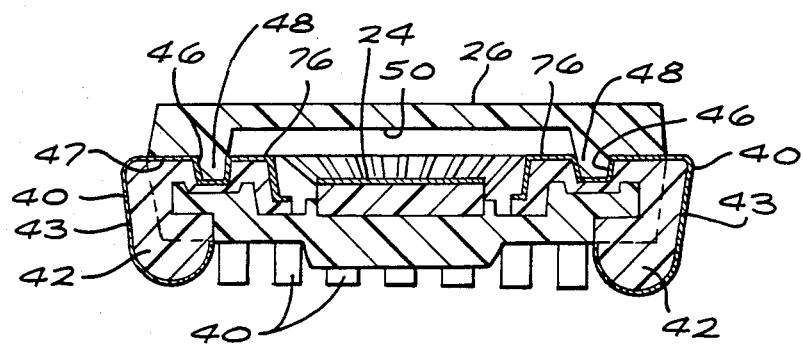
FIG. 6 is a cross-sectional view like that of FIG. 3 with the protective cap on the carrier body.

A molded chip carrier 20 built in accordance with the present invention is shown in FIGS. 1 to 6. The chip carrier 20 includes an integral carrier body or housing 22 having a central pedestal 24 upon which a chip 25 (shown only in FIG. 1) is mounted. A protective cap 26 that covers and protects the chip from moisture and contaminants is shown above the carrier body 22 in FIG. 1. FIG. 6 shows a cross-sectional view of the protective cap 26 as it is mounted onto the carrier body 22.

Figure 2:
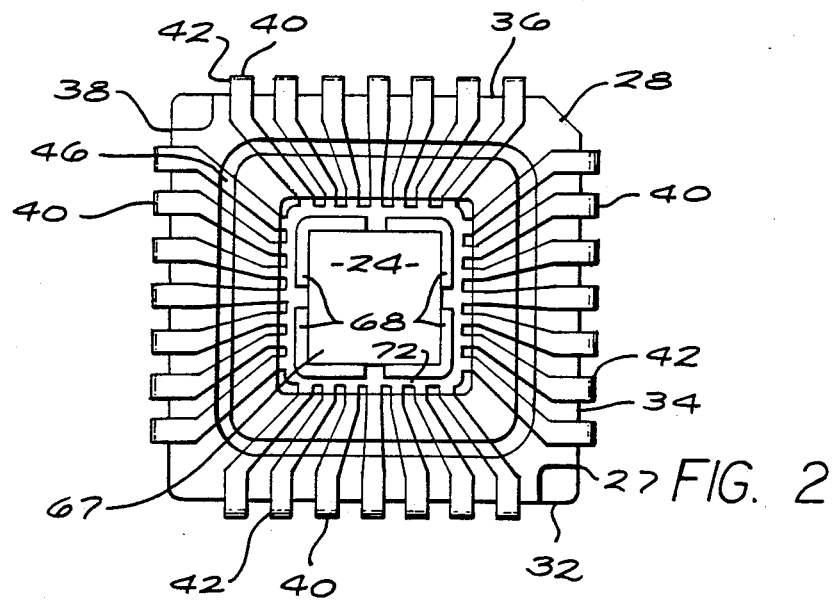
FIG. 2 is a top plan view of the chip carrier as shown in FIG. 1.
Figure 4:
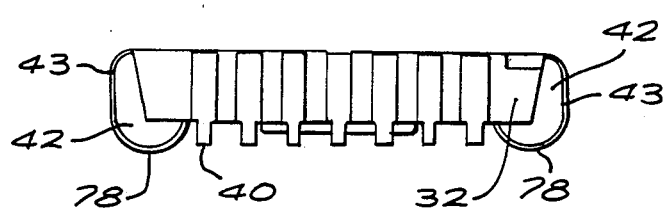
FIG. 4 is a side elevational view of the embodiment shown in FIG. 1.
Figure 5:
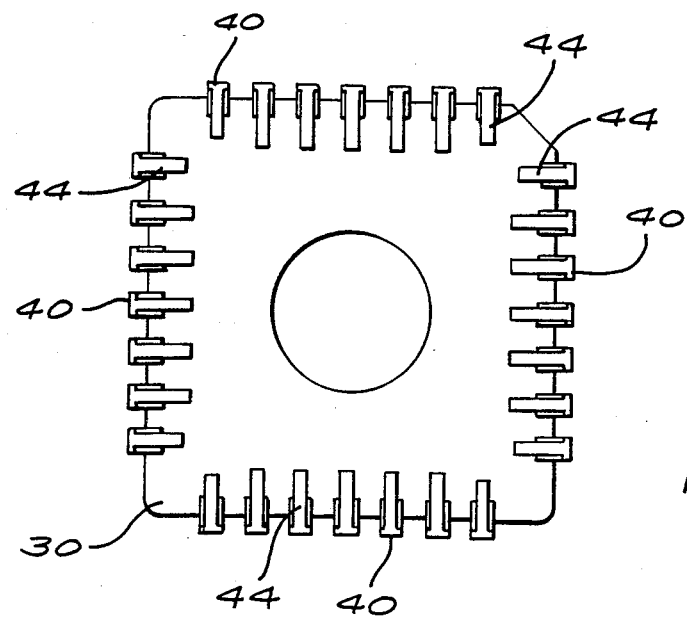
FIG. 5 is a bottom plan view of the embodiment shown in FIG. 1.

The integral carrier body 22 includes a top portion 28 (FIGS. 1 and 2), a bottom portion 30 (FIGS. 1 and 5) and at least one side portion 32 (FIGS. 1 and 4). Since the top portion 28 takes on a square shape, there are three additional side portions 34, 36 and 38 formed on the carrier body 22. (FIGS. 1 and 2). However, the top portion 28 may be any geometric shape, such as a circle, for example, in which case there would be only one continuous side portion. Also, the top portion can be rectangular in shape depending, of course, upon the geometry needed on the printed circuit board.

The top portion 28 includes the central pedestal 24 mentioned above on which the chip is mounted. The top portion has numerous continuous conductive paths or leads 40 that extend radially at first, from the central pedestal 24 toward the outer periphery 27 of the top portion 28. These leads 40 extend downward then, along the side portions 32, 34, 36 and 38 (see FIG. 1 and 4) and terminate at the bottom portion 30 of the carrier body. The chip 25 is shown in FIG. 1 as it is attached to some of the leads 40 along the top portion using known techniques in the art. For example, gold ball wire bonding may be used in which strands of gold wire 41 (FIG. 1) having about one-third the thickness of a human hair are bonded to the chip 25 and leads 40 by means of ultrasonic energy.

In FIGS. 1 through 6, there are seven leads found on each side portion of the carrier body. The number of leads can vary depending upon the number of input/output terminals required for the particular circuit design.

Figure 3:
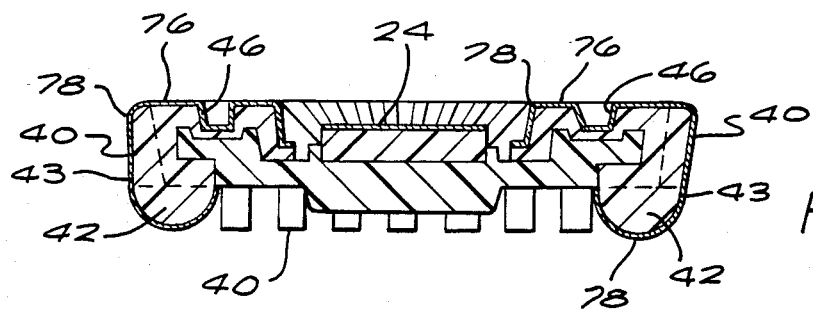
FIG. 3 is a cross-sectional view of the embodiment shown in FIG. 1 taken along line 3—3 of FIG. 1.

Each lead 40 extends along a side portion down to the bottom portion of the carrier body on a fin-like projection 42 that extends outward away from the periphery of the carrier body (see FIGS. 3 and 4). In FIGS. 3 and 4, each lead appears as a J-shaped member that extends along the outer edge 43 of each fin-like projection 42. A bottom section 44 of each lead (FIG. 5) may be attached to conductive pads or "footprints" (not shown) which are printed on circuit boards to which the chip carriers are mounted. Generally, the leads are attached to these pads by solder or other attachment method known in the art.

The top portion 28 of the carrier body further includes a channel 46 that provides a recess for receiving the protective cap. This channel 46 is designed to receive a projecting ridge 48 (see FIG. 6) located on the undersurface 47 of the protective cap 26. This ridge 48 fits within the channel and can be glued or otherwise adhesively attached to the carrier body to ensure that the cap remains fastened to the carrier body during use. Referring to FIG. 6, the projecting ridge 48 provides an exact fit within the channel 46 to prevent moisture, dust, and other unwanted environmental contaminants from entering the encapsulated portion of the carrier body. The cap 26 includes a recess 50 that allows ample room for the chip mounted on the central pedestal 24. Also, this recess 50 accommodates the previously mentioned gold wires or the like which attach the chip to the desired leads.

Referring again to FIGS. 2, 3 and 6, it can be seen that the leads extend across the channel 46. This particular construction provides economical circuit continuity despite the use of a protective cap that forms a virtually airtight compartment once fitted on the carrier body. The projecting ridge 48 and channel 46 in combination form an encapsulating barrier that prevents traces of environmental contaminants from coming into contact with the chip.

Figure 7:
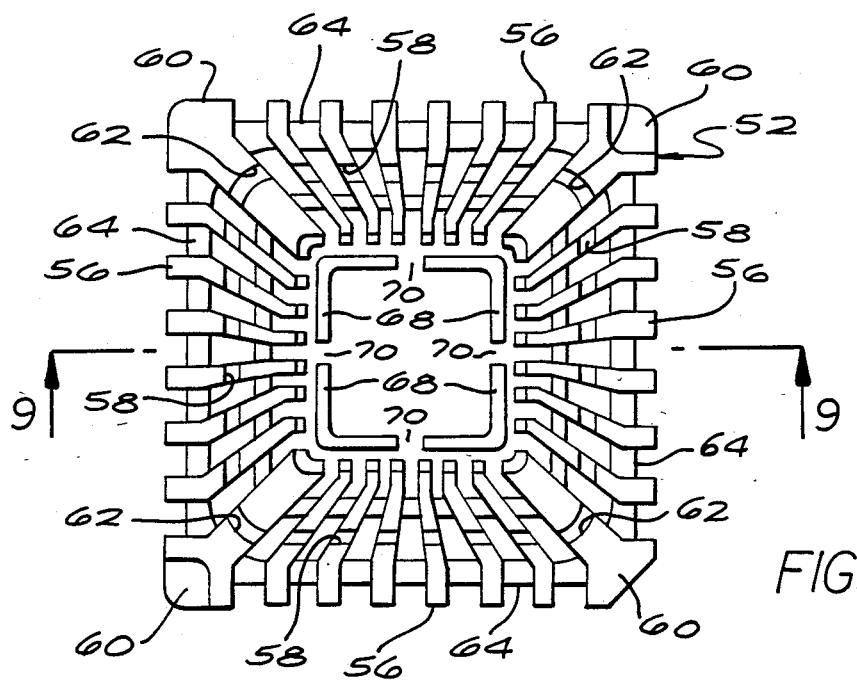
FIG. 7 is a top plan view of a first molded section used to form the embodiment of the carrier body shown in FIG. 1.
Figure 8:
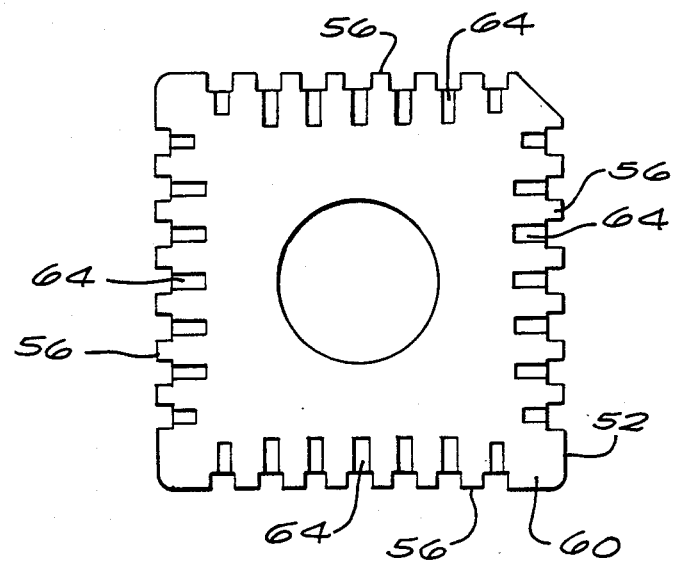
FIG. 8 is a bottom plan view of the first molded section shown in FIG. 7.
Figure 9:
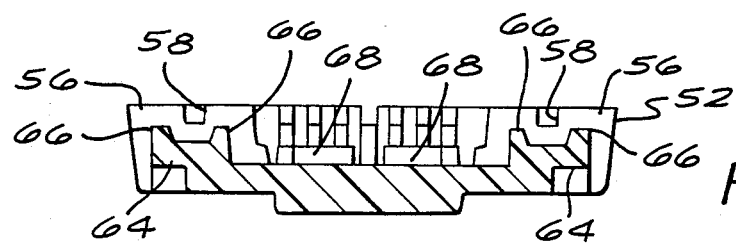
FIG. 9 is a cross-sectional view of the first molded section taken along line 9—9 of FIG. 7.
Figure 10:
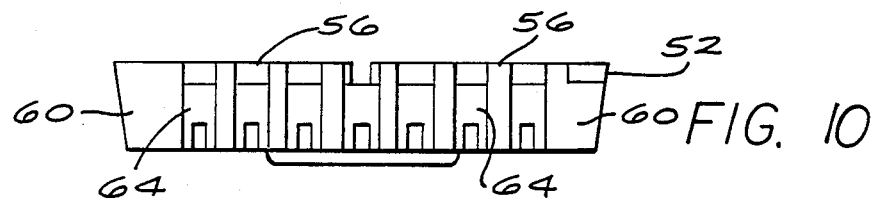
FIG. 10 is a side elevational view of the first molded section shown in FIG. 7.

Referring now to FIGS. 7 through 12, the construction of the carrier can be analyzed. Referring first to FIG. 7, the carrier body is composed of a first molded section 52 which is molded into a predetermined shape. This first section 52 cooperates with a second molded section (described below) to form the integral carrier body. One of many shapes for the first molded section 52 that can be used to create the carrier body is shown in FIGS. 7 through 10.

The second molded section 54 (see FIGS. 11 and 12) is formed about and upon the first molded section 52 depicted in FIG. 7. In the particular embodiment shown in FIGS. 7 to 12, the first molded section is initially molded using injection molding techniques well known in the art. After being formed, the first molded section 52 can be placed in a second mold to allow the second molded section 54 to be formed about and on particular structural elements of the first molded section. This second molded section, the only part which will carry a conductive deposit, is also made in a mold using known injection molding techniques. It should be appreciated, however that the present invention can use any molding or casting techniques that will result in an integral carrier body that is formed by two individual molded sections.

Referring back to FIG. 7, the first molded section 52 is shown having a number of radial ribs 56 that help make up the top surface of the carrier body. These upper ribs 56 include a notch 58 that defines part of the channel 46 that is formed in the top surface. Four intermediate upper ribs 60 are also diagonally formed in the four corners of the first molded section. These intermediate upper ribs 60 make up a wider portion of the top surface and like the other upper ribs 56, include notches 62 defined in the upper surface to help form the continuous channel 46 that will appear once the second molded section is created about and on the first molded section.

The first molded section 52 also includes alternating lower radial ribs 64 interposed in radial slots between the upper ribs 56 and intermediate upper ribs 60. These lower ribs form a structural surface that allows a portion of the second molded section to "grip" onto the first molded section. Each lower rib 64 extends radially outward and includes a pair of upper secondary walls 66 (FIG. 9) that also help retain the second molded section on the first molded section. The first molded section also includes four corner bosses or ridges 68 that surround the central portion and will but against the central pedestal 24 (FIGS. 1 through 3, and 6) that is later formed by the second molded section.

Figure 11:
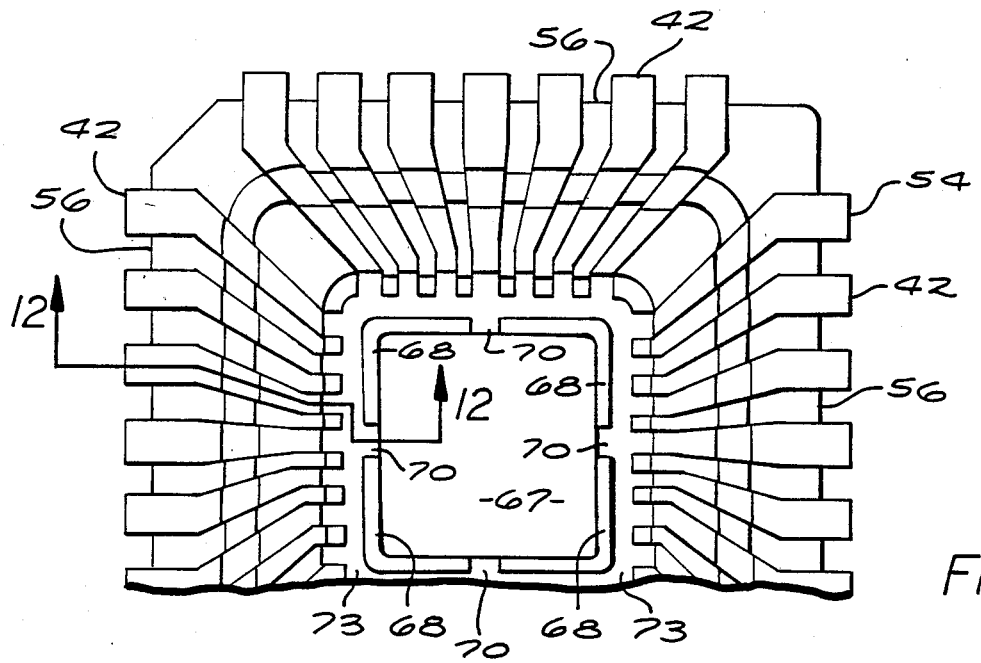
FIG. 11 is an enlarged top plan view showing the first molded section depicted in FIG. 7 and a second molded section.
Figure 12:
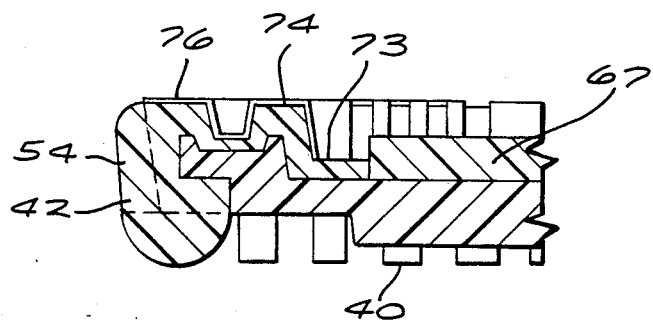
FIG. 12 is a partial cross-sectional view taken along line 12—12 of FIG. 11.

Referring now to FIGS. 11 and 12, the first molded section 52 is shown as it appears after the second molded section 54 has been formed. The second molded section 54 is formed to create among other things, the fin-like projections 42 upon which the leads of the carrier body will be placed. These projections 42 appear between the upper ribs 56, 60 at the positions along the sides 32-38 where the lower ribs 64 were formed on the first molded section. Referring to FIG. 12, the second molded section 54 is formed around each lower rib 64 to maintain proper contact with the first molded portion. Thus the radial segments of the leads 40 will be formed in the radial slots between the upper ribs 56, 60.

It should be remembered that the interface between the first and second molded sections is strong enough to maintain the two sections together. This interface is created by injecting the material that makes up the second molded section into the small crevices that form naturally on the surface of the first molded section. Although microscopic, this interconnection between the two materials that make up the first and second sections is sufficient to form a stron bond. The lower ribs and other projections formed on the first molded section merely provide additional surface area that allows additional interconnecting or bonding area for the two sections.

During the molding process, the second molded section 54 is allowed to form around and upon the first molded section and come in contact with the material that makes up the first molded section. Since injection molding is used in the embodiment described here, the material that forms the second molded section is allowed to move into the central portion of the first molded section to form the central pedestal 24 upon which the chip is to be mounted. Referring to FIG. 11, there are four openings 70 between each pair of the corner bosses or ridges 68 which allow the material to flow into the central portion. The material also flows along the radial slots between the upper ribs 56, 60; and near the ridges 68 also flows between the inner ends of the slots to ensure proper formation of the second molded section. Later, a second channel 72 (FIGS. 1 and 2) will be cut into the second molded section to remove this excess material 73 that interconnects the radial slots. As mentioned earlier, the material of the second molded section will receive a conductive deposit to form the leads 40. In use, each lead must be a separate and continuous path that extends along a respective radial slot from the top to the central portion of the carrier body. Therefore, any excess material formed during the molding operation must be removed otherwise all of the radial slots and thus all of the leads would be interconnected to each other.

Referring now to FIG. 12, the second molded section is formed with the first molded section so that the exposed outer surfaces 74 of the second molded section between the upper ribs 56, 60 are slightly below the exposed outer surfaces 76 of the first molded section. These lower exposed outer surfaces 74 constitute locations where conductive deposits can be later disposed to form the radial portions of the electrical leads formed on the carrier body.

The conductive deposit is usually a very thin metallic layer. Once the second molded section has been formed over the first molded section, there are exposed surfaces of the first and second molded sections that take on specific shapes. By choosing suitable material for the first and second molded sections, it is possible to deposit a conductive deposit on the exposed outer surfaces of the second molded section only. Since the exposed outer surfaces of the second molded section are shaped to form the leads, the conductive deposit will adhere only to this section to create the continuous conductive paths.

Referring back to FIGS. 3 to 5, a conductive deposit 78 is disposed on the exposed surfaces of the second molded section to form the leads 40 (FIG. 1) found on the carrier body. The conductive deposit 78 is flush with the exposed outer surface 76 of the first molded section along the top portion of the carrier body since proper designing of the two molded sections produces an exposed outer surface on the second molded section that is slightly lower than the other surface. When the conductive deposit is placed on this surface, the thickness of the deposit makes up the slight difference so that the leads are flush with the other surface.

The conductive deposit 78 is also placed on the mounting surface 24 formed in the central portion of the carrier body. This particular construction provides for the chip a conductive mounting surface that is insulated from the conductive leads.

The material used to form the first molded section is, in the first embodiment of FIGS. 1-12, a non-conductive material, such as a plastic, that cannot receive a conductive deposit. The second molded section, on the other hand, is made from a non-conducting material which includes a catalyst that makes the material capable of receiving a conductive deposit. After the integral carrier body has been formed, the conductive deposit can be placed on the preselected exposed surfaces of the second molded section.

The method for producing the above-described chip carrier includes, as a first step, molding a first section into a first predetermined shape. This step corresponds to molding the first molded section 52 as is depicted in FIG. 7.

The next step is to mold a second section with a second predetermined shape. Again, this step corresponds to molding the second section 54 as appears in FIGS. 11 and 12. These two steps help form an integral carrier body when the first and second sections are combined. This carrier body has exposed areas comprising portions of said first and second section.

Finally, the last step is to deposit a conductive material on an exposed area of one of first and said second sections but not on the other. Since either of the first or second sections is made from a non-conductive material that can receive a conductive deposit, this conductive material will remain on the exposed area of that particular section and not the other.

A further step may include preparing one of the first and second molded sections for adhesion promotion prior to the depositing step. This adhesion step is described below. The method may also particularly call for the conductive material to be metallic deposit. The metallic deposit may be placed on either the first or second molded section by a process known as adherent metallization.

Before the metal coating can be added to the second molded section, the material that makes up the second molded section may undergo the adhesion promotion process that prepares the preselected surfaces for the metal deposition. A description of an adhesion promotion process is found U.K. patent application Ser. No. 2,171,355 to Cleveland, et al. The process consists of the following steps:

1. Immerse the carrier body for one minute in a solution of 90% dimethylformamide and 10% water.
2. Immerse the carrier body for one minute in an aqueous 0.4 g/l solution of GAFAC RE610 at 60° C.
3. Immerse the carrier body for one minute in an aqueous solution of 48% sulfuric acid at 60° C.
4. Etch the carrier body for two minutes at 60° C. in an aqueous solution containing:
   a. chromium trioxide 400 g/l
   b. sulfuric acid 450 g/l
   c. perfluoroalkysulfonate 0.5 g/l
5. Rinse the carrier body in a dragout rinse.
6. Neutralize the residual chromium by immersion for five minutes in a solution of 1.8% sulfuric acid and 1.4% hydrogen peroxide.
7. Repeat Step 6 for another neutralizing solution of the same composition.
8. Rinse the carrier body in water for two minutes.

The adhesion promotion process will make the surface of the carrier body microporous and hydrophilic. The catalyst will be exposed on the preselected portions of the second molded section. All the surfaces of the carrier body, while smooth and shiny before the adhesion promotion process, assume a matte appearance after the process.

After the carrier has undergone the adhesion promotion process, it can then be immersed in a electroless copper plating solution for one hour to deposit a layer of copper three micrometers thick on the outer surface sections of the second molded section. The carrier body can then be rinsed, dried at 60° C. for 30 minutes immersed in dichloromethane vapors over boiling dichloromethane liquid, and dried again at 60° C. for 30 minutes. In the process, the matted, hydrophilic surface of the second molded section is made smooth, hydrophobic and resistant to extraneous metal deposition.

The carrier body can then be cleaned in a hot alkaline soak cleaner, rinsed, deoxidized in dilute sulfuric acid and returned to the electroless copper plating solution to deposit 25 micrometers of metal such as copper to the preselected portion on the second molded section. This will complete the adherent metalization step to form the electrically conductive paths on the exposed surfaces of the second molded section.

Referring now to FIGS. 13 through 18, an alternative embodiment and method for making the chip carrier body is described.

Figure 13:
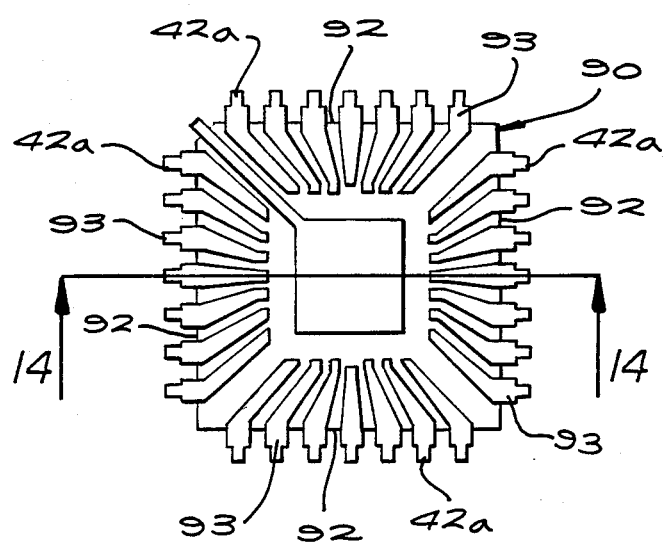
FIG. 13 is a top plan view of another form of a first molded section that helps form the chip carrier.
Figure 14:
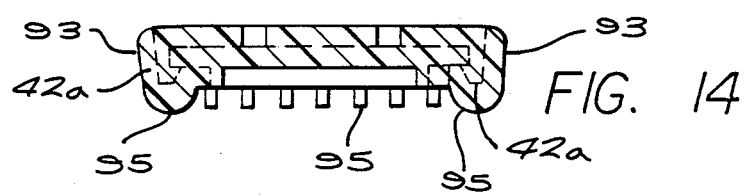
FIG. 14 is a cross-sectional elevational view taken along line 14—14 of FIG. 13.
Figure 15:
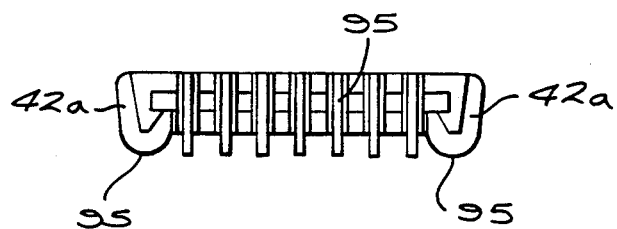
FIG. 15 is a side elevational view of the embodiment shown in FIG. 13.

Referring first to FIG. 13, a first molded section 90 having a predetermined shape is initially produced using known injection molding techniques. This first molded section 90 is significantly different from the first molded section of the first embodiment, since the fin-like projections 42a are formed on this first molded section 90 rather than on the second molded section as was previously described. Referring to FIGS. 13 through 15, the first molded section 90 includes the fin-like projections 42a and alternating spaces 92 for retaining the second molded section. The first molded section 90 shown in FIG. 13 has exposed lead surfaces 93 that will be later covered with the conductive deposit to form the continuous leads that extend from the top portion. The conductive deposit will also be deposited on the outer edge 95 of each of the projections 42a that extend along the peripheral edges of the first molded section. After the first molded section has been formed, it can then be placed into a second mold so that the second molded section can be molded about it.

Figure 16:
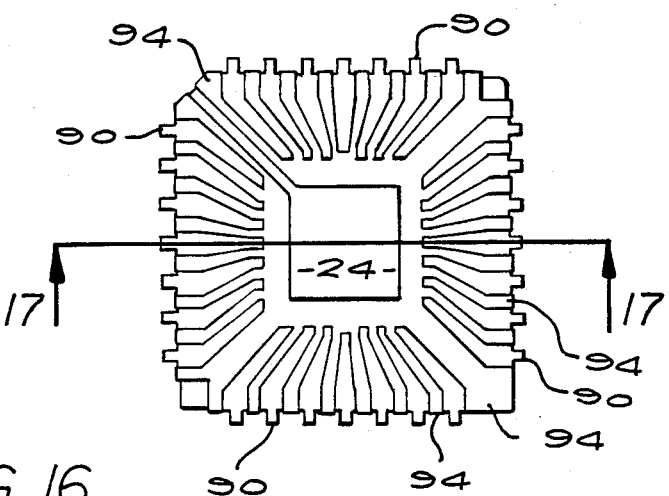
FIG. 16 is a plan view showing the first molded section depicted in FIG. 13 and a second molded section.
Figure 17:
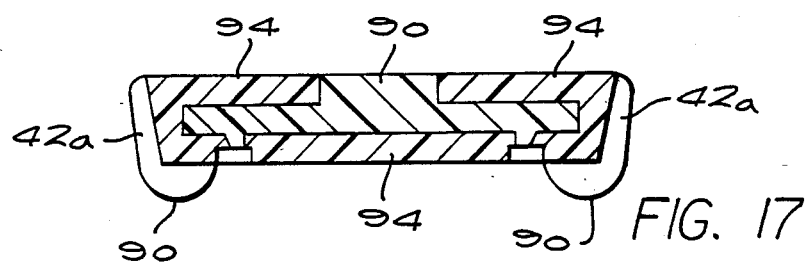
FIG. 17 is a cross-sectional elevational view taken along line 17—17 of FIG. 16.
Figure 18:
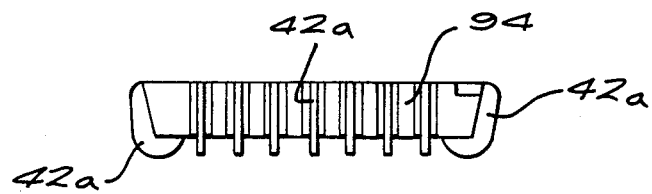
FIG. 18 is a side elevational view of the embodiment shown in FIG. 16.

A second molded section 94 molded about the first molded surface 90 is shown in FIGS. 16 through 18. The second molded section 94 extends over the first molded section and in between the individual lead surface 93 formed on the first molded section. In this embodiment, the first and second molded sections are formed so that a thin conductive deposit of metal can be placed on the preselected surfaces of the first molded section. Once the metallic deposit has been adhered, it will be flush with the outer surfaces that extend along the top portion of the second molded section.

In this particular embodiment, the first molded section is made from a material that is non-conductive but is capable of receiving a conductive deposit. The second molded section is made from a material that is non-conductive and which cannot receive the conductive deposit. After the first and second molded sections have been formed to create the preselected exposed outer shapes, the entire unit undergoes the adhering process described above. Once the first and second molded sections have been coated with the conductive deposit, the finished product (FIG. 16) will look similar to the carrier body shown in FIG. 1. This second embodiment is shown without the channel 46 formed in the top portion of the carrier body in the first embodiment, however, a similar channel can be formed by the first and second molded sections if desired. Also, a protective cap could also be placed over the second embodiment of the carrier body; however, it is not shown.

The benefits of utilizing a two mold process for making a chip carrier body includes the ability to keep the coplanarity of the leads to about ±2 mils. Since molding techniques are used, there is great precision in forming the leads and the projections that the leads are placed on. This structure greatly enhances the ability to control the length and shape of the leads. Also, the rigid structure of the fin-like projections virtually eliminates inadvertant breakage of bending of the leads.

The materials that are used to form the first and second molded sections can be any plastic or other suitable material that achieves the desired results. For instance, one non-conductive material capable of receiving the conductive deposit is polyethersulfone with a catalyst. The section which is incapable of receiving the conductive deposition may be polyethersulfone without a catalyst.

In the foregoing description, the term "chip" has been used in a generic sense since the present invention is capable of housing any type of chip material. The term is not limited to a semiconductor chip, but rather any piece of chip material used in connection with electronic products. For instance, the present invention can house active or passive components along with any other component that is capable of being used in chip form.

Thus, there has been illustrated and described a molded chip carrier and protective cap that fulfills all the objects and advantages set forth above; it should be understood that many changes, modifications, variations and other uses and applications will become apparent to those skilled in the art after considering the disclosure and the accompanying drawings. Therefore, any and all such changes, modifications, variations and other uses and applications that do not depart from the spirit and scope of the invention are deemed to be covered by the invention, which accordingly is limited only by the following claims.

What is claimed is:

1. A chip carrier having a central portion for receiving an electronic component in chip form, comprising:
   a first molded section having a first predetermined shape;
   a second molded section having a second predetermined shape;
   said first and second molded sections forming an integral carrier body which includes a generally peripheral wall that defines an integrally molded protective cavity, said peripheral wall having an exterior surface, a top surface, and an inward-facing surface, and protected within the integrally molded cavity a mounting site for such electronic component;
   wherein each of said first and said second molded sections has an exposed surface; but one of said molded sections is relatively much more susceptible to receiving a deposit of conductive material on its exposed surface, and the other of said molded sections is relatively much more resistant to receiving such a deposit on its exposed surface;
   a conductive material deposit, on the exposed surface that is relatively more susceptible to receiving a deposit of conductive material, and defining electrical leads that extend, continuously along said exterior, top, and inward-facing surfaces of said generally peripheral wall, into said integrally molded protective cavity;
   whereby electrical connections between the electrical leads and a component installed on the mounting site can be made entirely within and protected by the integrally molded cavity of the integral carrier body.

2. The carrier of claim 1, wherein:
   the electrical leads extend into said integrally molded cavity to inner ends that are immediately adjacent to said mounting site;
   whereby such electrical connections between the inner ends of the leads and a component installed on the mounting site need span only a very short gap that is well within and entirely protected by the integrally molded cavity.

3. The carrier of claim 2, wherein:
   the electrical leads slope radially outward and upward from within the cavity to the top surface of the wall, and extend radially outward along the top of the wall.

4. The carrier of claim 2, wherein:
   the mounting site comprises a component-mounting pedestal formed within the integrally molded protective cavity; and
   the inner ends of the leads are elevated from a bottom surface of the integrally molded cavity;
   whereby such electrical connections while spanning said short gap between the inner ends of the leads and a component installed on the mounting-site pedestal are elevated from a bottom surface of the integrally molded cavity.

5. The carrier of claim 1, wherein:
   a generally peripheral channel is defined in said top surface of the wall; and
   the conductive material extends, at two sides of the channel, downward into the channel; and extends across the channel.

6. The carrier of claim 5, further comprising:
   a protective cap having a projecting ridge extending therefrom, said projecting ridge being receivable within the channel.

7. The chip carrier as defined in claim 1, wherein:
   said first molded section is made from a nonconductive material that is more resistant to receiving a conductive deposit; and
   said second molded section is made from a nonconductive material that is more susceptible to receiving a conductive deposit.

8. The chip carrier as defined in claim 7 wherein said first and second molded sections form an integral carrier body having a top portion, a bottom portion, and at least one side portion, said second molded section forming a plurality of noninterconnecting, continuous paths extending from said top portion, along said side portion and to said bottom portion, said conductive material being deposited on said paths.

9. The chip carrier as defined in claim 8 wherein said second molded section includes a plurality of fin-like shaped projections extending along said side and bottom portions of said carrier body, and each continuous path extends along an outer edge of one of said fin-like projections.

10. The chip carrier as defined in claim 8 wherein said conductive material is a metallic deposit.

11. The chip carrier as defined in claim 10 wherein said second molded section is made from a nonconductive material having a catalyst which makes said material receptive to adherent metalization.

12. The chip carrier as defined in claim 1, wherein:
    said second molded section is made from a nonconductive material that is more resistant to receiving a conductive deposit; and
    said first molded section is made from a nonconductive material that is more susceptible to receiving a conductive deposit, said second molded section being molded about said first molded section.

13. The chip carrier as defined in claim 12 wherein said integral carrier body includes a top portion, a bottom portion and at least one side portion, said first portion having a plurality of non-overlapping, continuous paths formed thereon that extend for said to portion along said side portions to said bottom portion.

14. The chip carrier as defined in claim 13 wherein said first molded section forms a plurality of fin-like projections extending along said side and bottom portions of said carrier body, and each of said continuous paths extends along an outer edge of one of said fin-like projections.

15. The chip carrier as defined in claim 13 wherein said conductive material is a metallic deposit.

16. The chip carrier as defined in claim 15 wherein said first molded section is made from a nonconductive material having a catalyst that makes the material receptive to adherent metalization.

17. A chip carrier having a central portion for receiving an electronic component in chip form, comprising:
   a first molded section having a first predetermined shape;
   a second molded section having a second predetermined shape;
   said first and second molded sections forming an integral carrier body;
   wherein each of said first and said second molded sections has an exposed outer surface; but one of said molded sections is relatively much more susceptible to receiving a deposit of conductive material on its exposed outer surface, and the other of said molded sections is relatively much more resistant to receiving such a deposit on its exposed outer surface;
   a conductive material deposit, on the outer surface that is relatively more susceptible to receiving a deposit of conductive material; and wherein:
   said first molded section is made from a nonconductive material that is more resistant to receiving a conductive deposit;
   said second molded section is made from a nonconductive material that is more susceptible to receiving a conductive deposit; and
   said integral carrier body includes a top portion, a bottom portion, and at least one side portion, said top portion having a continuous channel extending therein and further including a protective cap having a projecting ridge extending therefrom, said projecting ridge being receivable in said channel.

18. The chip carrier as defined in claim 17 wherein each of said continuous paths extend across and form a portion of said channel that extends into said top portion.

19. The chip carrier as defined in claim 18 wherein said conductive deposit is a metallic deposit.

20. A chip carrier having a central portion for receiving an electronic component in chip form, comprising:
   a first molded section having a first predetermined shape;
   a second molded section having a second predetermined shape;
   said first and second molded sections forming an integral carrier body which includes an integrally molded protective cavity, and protected within the integrally molded cavity a mounting site for such electronic component;
   wherein each of said first and said second molded sections has an exposed surface; but one of said molded sections is relatively much more susceptible to receiving a deposit of conductive material on its exposed surface, and the other of said molded sections is relatively much more resistant to receiving such a deposit on its exposed surface;
   a conductive material deposit, on the surface that is relatively more susceptible to receiving a deposit of conductive material, and defining electrical leads that extend into said integrally molded protective cavity;
   whereby electrical connections between the electrical leads and a component installed on the mounting site can be made entirely within and protected by the integrally molded cavity of the integral carrier body;
   wherein the integral carrier body further comprises at least one side portion that has a top; and
   wherein at least along part of the top of the side portion, the electrical leads are defined along surfaces that are recessed by distances substantially equal to the respective thicknesses of the leads;
   whereby the leads are flush with the top of the side portion, along at least a part of the top of the side portion.

21. The carrier of claim 20, wherein:
   said side portion further has an outer surface; and
   from the top of the side portion the leads extend downward along the outer surface along outward-projecting fins defined in the outer surface.

22. The carrier of claim 21, wherein:
   the carrier body also has a bottom portion, and J-shaped bosses defined in the bottom portion; and
   the leads extend downward from the fins to and along undersurfaces of the J-shaped bosses.

23. A chip carrier having a central portion for receiving an electronic component in chip form, comprising:
   a first molded section having a first predetermined shape;
   a second molded section having a second predetermined shape;
   said first and second molded sections forming an integral carrier body;
   each of said first and said second molded sections having an exposed outer surface; but one of said molded sections being relatively much more susceptible to receiving a deposit of conductive material on its exposed outer surface, and the other of said molded sections being relatively much more resistant to receiving such a deposit on its exposed outer surface; and
   a conductive material deposit, on the outer surface that is relatively more susceptible to receiving a deposit of conductive material; and wherein:
   said first molded section is made from a nonconductive material that is more resistant to receiving a conductive deposit;
   said second molded section is made from a nonconductive material that is more susceptible to receiving a conductive deposit;
   said first and second molded sections form an integral carrier body having a top portion, a bottom portion, and at least one side portion, said second molded section forming a plurality of noninterconnecting, continuous paths extending from said top portion, along said side portion and to said bottom portion, said conductive material being deposited on said paths; and
   said top portion has a continuous channel extending therein and further including a protective cap having a continuous projecting ridge extending therefrom, said projecting ridge being receivable in said channel.

24. The chip carrier as defined in claim 23 wherein each of said continuous paths extends across and forms a portion of said channel that extends into said top portion.

25. The chip carrier as defined in claim 24 wherein said conductive material is a metallic deposit.

26. A chip carrier having a central portion for receiving an electronic component in chip form, comprising:
   a first molded section having a first predetermined shape;
   a second molded section having a second predetermined shape;

said first and second molded sections forming an integral carrier body;

each of said first and said second molded sections having an exposed outer surface; but one of said molded sections being relatively much more susceptible to receiving a deposit of conductive material on its exposed outer surface, and the other of said molded sections being relatively much more resistant to receiving such a deposit on its exposed outer surface; and a conductive material deposit, on the outer surface that is relatively more susceptible to receiving a deposit of conductive material; and wherein:

said second molded section is made from a nonconductive material that is more resistant to receiving a conductive deposit;

said first molded section is made from a nonconductive material that is more susceptible to receiving a conductive deposit, said second molded section being molded about said first molded section; and said integral carrier body includes a top portion, a bottom portion, and at least one side portion, said top portion having a continuous channel extending therein and further including a protective cap having a projecting ridge extending therefrom, said projecting ridge being receivable within said channel.

27. A chip carrier having a central portion for receiving an electronic component in chip form, comprising:
a first molded section having a first predetermined shape;

a second molded section having a second predetermined shape;

said first and second molded sections forming an integral carrier body which includes an integrally molded protective cavity, and protected within the integrally molded cavity a mounting site for such electronic component;

wherein each of said first and said second molded sections has an exposed surface; but one of said molded sections is relatively much more susceptible to receiving a deposit of conductive material on its exposed surface, and the other of said molded sections is relatively much more resistant to receiving such a deposit on its exposed surface;

a conductive material deposit, on the surface that is relatively more susceptible to receiving a deposit of conductive material, and defining electrical leads that extend into said integrally molded protective cavity;

whereby electrical connections between the electrical leads and a component installed on the mounting site can be made entirely within and protected by the integrally molded cavity of the integral carrier body;

wherein said second molded section is made from a nonconductive material that is more resistant to receiving a conductive deposit;

wherein said first molded section is made from a nonconductive material that is more susceptible to receiving a conductive deposit, said second molded section being molded about said first molded section;

wherein said integral carrier body includes a top portion, a bottom portion and at least one side portion, said first portion having a plurality of nonoverlapping, continuous paths formed thereon that extend from said top portion along said side portions to said bottom portion; and wherein said top portion has a continuous channel extending therein; and further including a protective cap having a projecting ridge extending therefrom, said projecting ridge being receivable in said channel.

28. A chip carrier having a central portion for receiving an electronic component in chip form, comprising:
a first molded section having a first predetermined shape;

a second molded section having a second predetermined shape;

said first and second molded sections forming an integral carrier body which includes an integrally molded protective cavity, and protected within the integrally molded cavity a mounting site for such electronic component;

wherein each of said first and said second molded sections has an exposed outer surface; but one of said molded sections is relatively much more susceptible to receiving a deposit of conductive material on its exposed outer surface, and the other of said molded sections is relatively much more resistant to receiving such a deposit on its exposed outer surface; a conductive material deposit, on the outer surface that is relatively more susceptible to receiving a deposit of conductive material, and defining electrical leads that extend into said integrally molded protective cavity;

whereby electrical connection between the electrical leads and a component installed on the mounting site can be made entirely within and protected by the integrally molded cavity of the integral carrier body;

wherein the electrical leads extend into said integrally molded cavity to inner ends that are immediately adjacent to said mounting site;

whereby such electrical connections between the inner ends of the leads and a component installed on the mounting site need span only a very short gap that is well within and entirely protected by the integrally molded cavity;

wherein the integral carrier body further comprises at least one side portion that has a top; and wherein the electrical leads slope radially outward and upward from within the cavity to the top of the side portion, and extend radially outward along the top of the side portion; and wherein at least along part of the top of the side portion, the electrical leads are defined along surfaces that are recessed by distances substantially equal to the respective thicknesses of the leads;

whereby the leads are flush with the top of the side portion, along at least a part of the top of the side portion.

29. A method for producing and using a chip carrier comprising the steps of:
molding a first section into a first predetermined shape;

molding a second section with a second predetermined shape;

in one of the two molding steps, creating first molded surfaces which after setting are relatively susceptible to receiving a deposit of conductive material; and, in the other of the two molding steps, creating second molded surfaces which after setting are relatively resistant to receiving a deposit of conductive material;

forming an integral carrier body when said first and said second sections are combined, said integral carrier body having a peripheral wall, and having exposed areas comprising portions of said first section and portions of said second section; said forming step comprising:

forming an exterior surface of the peripheral wall, forming a top surface of the peripheral wall, and forming an inward-facing surface of the peripheral wall;

depositing a conductive material to define electrical leads on the first molded surfaces but not the second molded surfaces; said depositing step comprising:

depositing conductive material to define leads that extend continuously along said exterior surface of the wall, depositing conductive material to define leads that extend continuously along said top surface of the wall, and that are respectively continuous with said leads that extend along said exterior surface of said wall, depositing conductive material to define leads that extend continuously along said inward-facing surface, and that are respectively continuous with said leads that extend along said top surface;

installing an integrated-circuit chip in the carrier, with connection points of the chip electrically interconnected with said conductive material on respective first molded surfaces; and securing the carrier to a circuit board and electrically interconnecting said conductive material on the first molded surfaces with respective elements of a conductive footprint on said circuit board.

30. The method of claim 29 further including the step of:

preparing one of the first and the second molded sections for adhesion promotion prior to the depositing step.

31. The method of claim 30 wherein said first molded section is formed from a non-conductive material and said second molded section is made from a non-conductive material that is capable of receiving a conductive deposit.

32. The method of claim 31 wherein said second molded section is formed having a outer exposed surface that defines a plurality of non-interconnecting, conductive paths that receive the conductive material.

33. The method of claim 32 wherein the conductive material is a metallic deposit.

34. The method of claim 33 wherein the metallic deposit is placed on the second molded section by adherent metallization.

35. The method of claim 30 wherein the second molded section is made from a non-conductive material and the first molded section is made from a non-conductive material that is capable of receiving a conductive deposit.

36. The method of claim 35 wherein the first molded section is formed with an exposed outer surface that defines a plurality of non-intersecting continuous paths that receive the conductive material.

37. The method of claim 36 wherein the conductive material is a metallic deposit.

38. The method of claim 37 wherein the metallic deposit is placed on the first molded section by adherent metallization.

* * * * *